(12) United States Patent
Hannah et al.

(10) Patent No.: US 7,612,370 B2
(45) Date of Patent: Nov. 3, 2009

(54) THERMAL INTERFACE

(75) Inventors: Eric C. Hannah, Pebble Beach, CA (US); Ralph M. Kling, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 934 days.

(21) Appl. No.: 10/750,488

(22) Filed: Dec. 31, 2003

(65) Prior Publication Data

US 2005/0145367 A1 Jul. 7, 2005

(51) Int. Cl.
*H01L 23/58* (2006.01)

(52) U.S. Cl. .................... 257/48; 257/40; 257/625; 257/712; 257/E21.521

(58) Field of Classification Search .......... 257/706, 257/712, 720, 713, 48, 625, 40; 361/704, 361/708; 977/800, 880, 900
See application file for complete search history.

(56) References Cited

U.S. PATENT DOCUMENTS

| 5,921,087 A * | 7/1999 | Bhatia et al. ............. 62/3.2 |
|---|---|---|
| 6,094,919 A * | 8/2000 | Bhatia ....................... 62/3.7 |
| 6,407,922 B1 * | 6/2002 | Eckblad et al. ............ 361/704 |
| 6,486,489 B2 * | 11/2002 | Watanabe et al. ............. 257/9 |
| 6,730,731 B2 * | 5/2004 | Tobita et al. ................ 524/495 |
| 6,831,359 B2 * | 12/2004 | Heilbronner .............. 257/720 |
| 6,856,016 B2 * | 2/2005 | Searls et al. ............... 257/720 |
| 6,924,335 B2 * | 8/2005 | Fan et al. .................. 524/495 |
| 7,060,224 B2 * | 6/2006 | Edman et al. .............. 422/68.1 |
| 2002/0145194 A1 * | 10/2002 | O'Connor et al. ........... 257/712 |
| 2003/0143382 A1 * | 7/2003 | Xu ............................ 428/209 |
| 2004/0125565 A1 * | 7/2004 | Chen et al. ................. 361/704 |
| 2005/0059238 A1 * | 3/2005 | Chen et al. ................. 438/672 |
| 2005/0105272 A1 * | 5/2005 | Prasher ..................... 361/699 |

* cited by examiner

*Primary Examiner*—Wai-Sing Louie
(74) *Attorney, Agent, or Firm*—Schwegman, Lundberg & Woessner, P.A.

(57) ABSTRACT

An apparatus including an interface having a number of nanostructures is described. The apparatus comprises heat source, a thermal management device, and an interface disposed between the thermal management device and the heat source. The interface a substrate has a number of nanostructures to facilitate heat transfer and adhesion between the heat source and the thermal management device.

8 Claims, 5 Drawing Sheets

100

THERMAL INTERFACE

TECHNICAL FIELD

The invention generally relates to cooling electronic apparatuses and systems, and in particular, but not exclusively, thermal interface material.

BACKGROUND INFORMATION

As electronic devices become more powerful and smaller (i.e., more densely packed), the power consumed by these electronic devices can result in a large amount of generated heat. The heat generated by these electronic devices may be detrimental to the operation of the electronic devices. Accordingly, a common concern associated with electronic components is heat removal.

For example, an electronic device may include an integrated circuit (IC) die. A thermal management device may be thermally coupled to the IC die to facilitate dissipation of heat from the IC die. Commonly, the thermal management device may be in the form of a heat sink type device. Accordingly, heat may be transferred from the IC die to the thermal management device, and in turn, the thermal management device facilitates transfer of the heat to the surrounding environment.

BRIEF DESCRIPTION OF THE DRAWINGS

The various embodiments of the invention is illustrated by way of example and not by way of limitation in the figures of the accompanying drawings, in which the like references indicate similar elements and in which.

DETAILED DESCRIPTION

In various embodiments, an apparatus having an interface comprising a number of nanostructures disposed between a thermal management device and a heat source is described. In the following description, various embodiments will be described. However, one skilled in the relevant art will recognize that the various embodiments may be practiced without one or more of the specific details, or with other methods, materials, components, etc. In other instances, well-known structures, materials, or operations are not shown or described in detail to avoid obscuring aspects of various embodiments of the invention. Similarly, for purposes of explanation, specific numbers, materials and configurations are set forth in order to provide a thorough understanding of the invention. Nevertheless, the invention may be practiced without the specific details. In other instances, well-known features are omitted or simplified in order not to obscure the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation.

Figure 1:
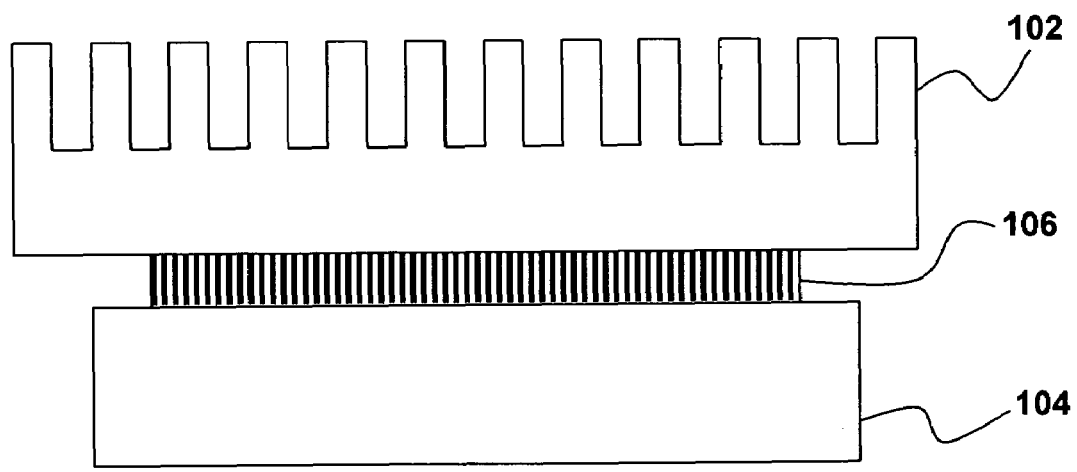
FIG. 1 illustrates an apparatus having an interface comprising a number of nanostructures, in accordance with various embodiments of the invention.

FIG. 1 illustrates an apparatus having an interface comprising a number of nanostructures, in accordance with various embodiments of the invention. Illustrated in FIG. 1 is cross sectional side like view of an apparatus 100. In FIG. 1, the apparatus 100 includes a thermal management device 102, a heat source 104, and an interface 106 disposed between the thermal management device 102 and the heat source 104. In accordance with various embodiments, the interface 106 has a number of nanostructures. As will be described in further detail, the interface 106 facilitates at least improved adhesion and thermal conductivity between the thermal management device 102 and the heat source 104.

In various embodiments, the thermal management device 102 may be part of a passive cooling device such as, but not limited to, a heat sink, a heat spreader, heat pipes, a heat slug, and the like, and any combination thereof. Alternatively, in various embodiments, the thermal management device 102 may be part of an active cooling device such as, but not limited to, an air jet impingement device, a dielectric liquid device, and any combination thereof.

In various embodiments, the heat source 104 may include an integrated circuit (IC), which may be in the form of a rectangular piece of semiconductor material commonly known as a chip or a die. Some examples of semiconductor material may include, but are not limited to, silicon, silicon on sapphire, silicon on insulator, gallium arsenide, and any combination thereof.

Figure 2:
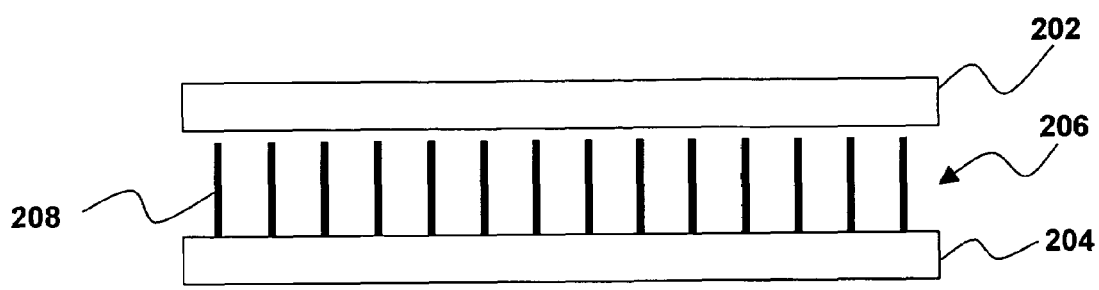
FIG. 2 illustrates an interface having a number of nanostructures, in accordance with one embodiment of the invention.

FIG. 2 illustrates an interface having a number of nanostructures, in accordance with one embodiment of the invention. In FIG. 2, a detailed view of an interface 206 between a heat source 204 and a thermal management device 202 is shown. The interface 206 includes a number of nanostructures 208. In the embodiment illustrated, the nanostructures 208 may be formed on the heat source 204, while the thermal management device 202 does not necessarily have nanostructures 208. Further, the nanostructures 208 are shown extending away from the heat source 204.

In various embodiments, the nanostructures 208 may comprise of carbon nanotubes. That is, each of the nanostructures 208 may have an approximate diameter of 0.6 to 1.8 nanometers, and a length of approximately 1-100 microns. The carbon nanotubes may be single walled, multi-walled, of various shapes, and may be coated with various coatings such as, but not limited to, metals. Accordingly, each of the nanostructures 208 may have relatively high heat transmission abilities such as, but not limited to, as high as 6000 Watts per meter Kelvin, thereby facilitating improved heat transfer between the heat source 204 and the thermal management device 202. Further, the nanostructures 208 may be formed from a variety of manners such as, but not limited to, utilizing an arc fullerene generator, chemical vapor deposition (CVD), and laser blasting.

Continuing to refer to FIG. 2, in the illustrated embodiment, the nanostructures 208 may facilitate adhesion between the heat source 204 and the thermal management device 202 due to various interactions between the nanostructures 208 and the thermal management device 202. For example, the nanostructures 208 may be attracted to thermal management device 202, in particular, to the surface of the thermal management device 202, due to Van der Waals' type forces.

In various embodiments, the nanostructures 208 may have molecules that helps to facilitate adhesion. For example, in one embodiment, the nanostructures 208 may have molecules in the form of flexible polymers such as, but not limited to, single stranded deoxyribonucleic acid (DNA) molecules. The molecules facilitate covalent type bonding between the nanostructures 208 and the thermal management device 202. Utilization of molecules with various nanostructures such as carbon nanostructures is known, and accordingly, will not be described in further detail.

In the embodiment illustrated in FIG. 2, the nanostructures 208 may be formed on the heat source 204. However, in alternate embodiments, the nanostructures 208 may be formed on the heat management device 202. Further, as will be described in detail, the nanostructures 208 may be formed on both the thermal management device 202 and the heat source 204. Additionally, the nanostructures 202 are shown substantially extending away from a surface. However, it should be appreciated that the nanostructures 202 may be formed in a variety of directions and manners including, but not limited to, various angles relative to a surface.

As a result, the interface 206 having the nanostructures facilitates improved heat transfer and adhesion between the heat source 204 and the thermal management device 202.

Figure 3:
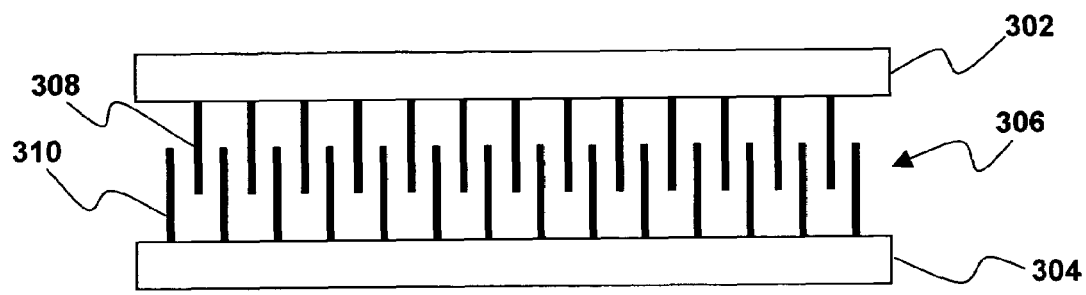
FIG. 3 illustrates an interface having a number of nanostructures, in accordance with another embodiment of the invention.

FIG. 3 illustrates an interface having a number of nanostructures, in accordance with another embodiment of the invention. As shown in FIG. 3, an interface 306, between a thermal management device 302 and a heat source 304, includes a number of nanostructures 308 & 310. In the illustrated embodiment, the nanostructures 308 & 310 may be formed on both the thermal management device 302 and the heat source 304. Further, the nanostructures 308 & 310 extend away from their respective surfaces (i.e., nanostructures 308 formed on the thermal management device 302 extend toward the nanostructures 310 formed on the heat source 302. As shown, the nanostructures 308 formed on the thermal management device 302 may interleave with the nanostructures 310 formed on the heat source 304.

The interleaved nanostructures 308 & 310 may be carbon nanotubes like structures, and accordingly, the interleaved nanostructures 308 & 310 may adhere to each other due to various attraction forces such as, but not limited to, Van der Waals' forces as previously described. Additionally, heat transfer between the thermal management device 302 and the heat source 304 may be improved due to the nanostructures 308 & 310 being made of nanostructures having relatively high thermal conductivity.

In various embodiments, the nanostructures 308 & 310 may have molecules that facilitate adhesion, as previously described. For example, the nanostructure 308 formed on the thermal management device 302 and/or the nanostructure 310 formed on the heat source 304 may have molecules that facilitate adhesion. That is, the nanostructures 308 & 310 may have molecules in the form of flexible polymers on either or both of the nanostructures 310 formed on the heat source 304 and the nanostructures 308 formed on the thermal management device 302. As previously described, the molecules facilitate covalent type bonding between the nanostructures 308 & 310.

Figure 4:
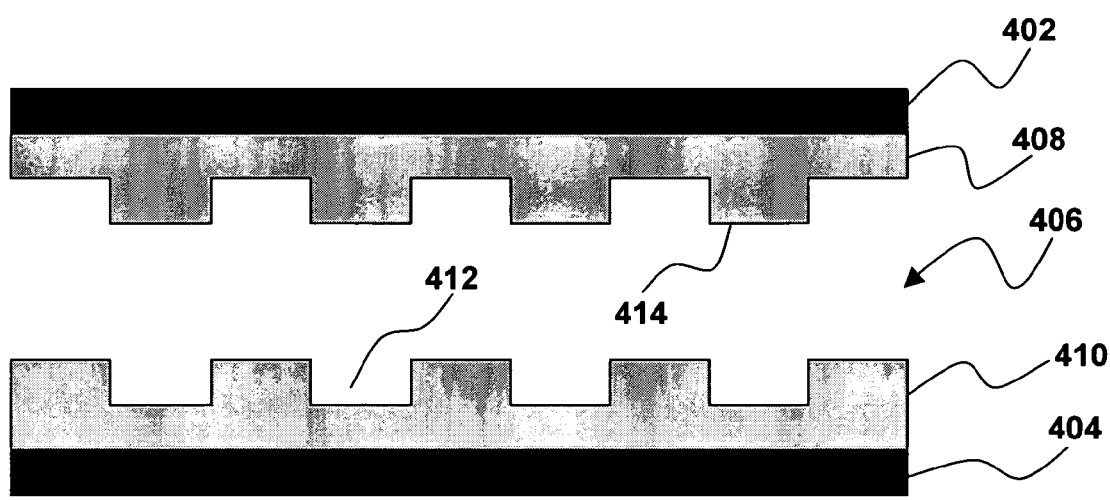
FIG. 4 illustrates an interface having a number of nanostructures, in accordance with another embodiment of the invention.

FIG. 4 illustrates an interface having a number of nanostructures, in accordance with another embodiment of the invention. In FIG. 4, an interface 406 between a thermal management device 402 and a heat source 404 is shown in detail. As shown in FIG. 4, the heat source 404 may have a number of nanostructures 410 that may be disposed in a predetermined manner to further facilitate coupling of a number of nanostructures 408 that may be disposed on the thermal management device 402. That is, in the embodiment illustrated in FIG. 4, the nanostructures 410 on the heat source 404 may be disposed in a pattern to receive the nanostructures 408 on the thermal management device 402, which may also be in a pattern to be received by the nanostructures 410 on the heat source 404 (e.g., male/female type pattern). Accordingly, the nanostructures 410 on the heat source 404 may be disposed to have recesses 412 while the nanostructures 408 on the thermal management device 402 may be disposed to have protrusions 414 that may be received into the recesses 412.

The nanostructures 408 and 410 may be carbon nanotubes like structures, and may also have molecules to facilitate adhesion of the nanostructures 408 and 410 to each other, which in turn, facilitate adhesion of the thermal management device 402 and the heat source 404.

Figure 5:
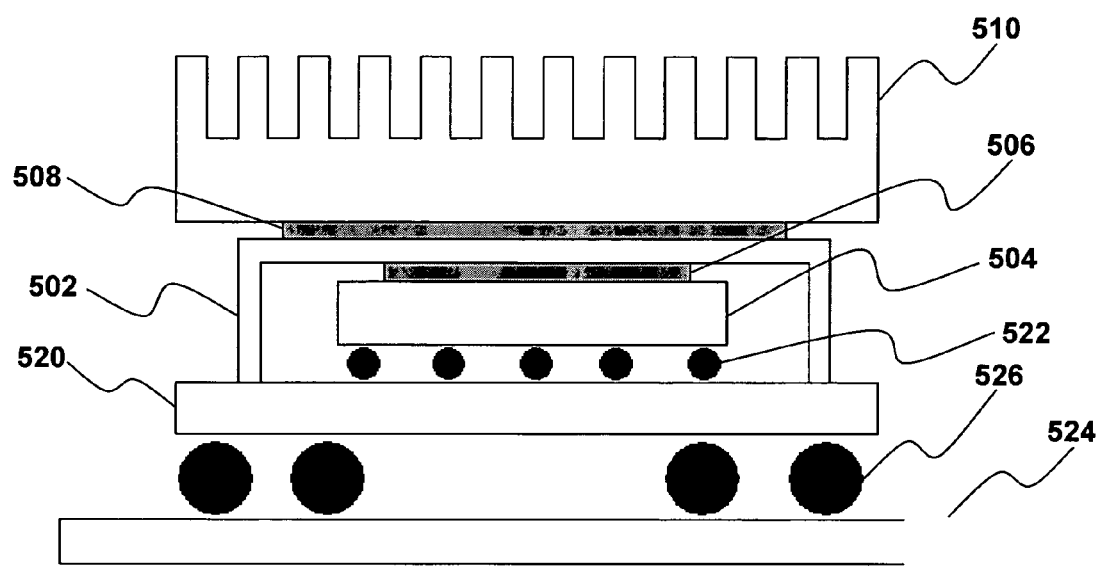
FIG. 5 illustrates an apparatus having an interface having a number of nanostructures, in accordance with various embodiments of the invention.

FIG. 5 illustrates an apparatus having an interface having a number of nanostructures, in accordance with various embodiments of the invention. In FIG. 5, apparatus 500 may include a heat source 504 thermally coupled to an interface 506. Additionally, a thermal management device 502 is shown thermally coupled to the interface 506. In turn, the thermal management device 502 is shown being thermally coupled to a heat dissipation device 510. Disposed between the heat management device 502 and the heat dissipation device 510 may be a second interface 508. The interface 506 and/or the second interface 508 may be of the type previously described with respect to FIGS. 1-4 or any combination thereof. In the illustrated embodiment, the heat source 504 may be in the form of an IC die, which may include integrated electrical devices and may be fabricated utilizing any suitable material and fabrication methods. In various embodiments, the heat source may comprise a microprocessor type chip having a silicon type substrate, as previously alluded to.

The heat source 504 may be electrically coupled to a substrate 520 via a number of solder bumps 522. The substrate 520 may be electrically coupled to a wiring board 524 via solder balls 526. In the illustrated embodiment of FIG. 5, the heat source 504 having the solder bumps 522, the interface 506, and the thermal management device 502 may be referred to as a semiconductor package. Accordingly, interfaces 506 and 508 may facilitate heat transfer and adhesion of various components of a semiconductor package.

Illustrated in FIG. 5, the thermal management device 502 may be thermally coupled to the heat dissipation device 510. However, it should be appreciated by those skilled in the relevant art that the heat source 504 may be thermally coupled directly to the heat dissipation device 510. That is, as previously alluded to, the thermal management device 502 may be a heat dissipations device as well.

Figure 6:
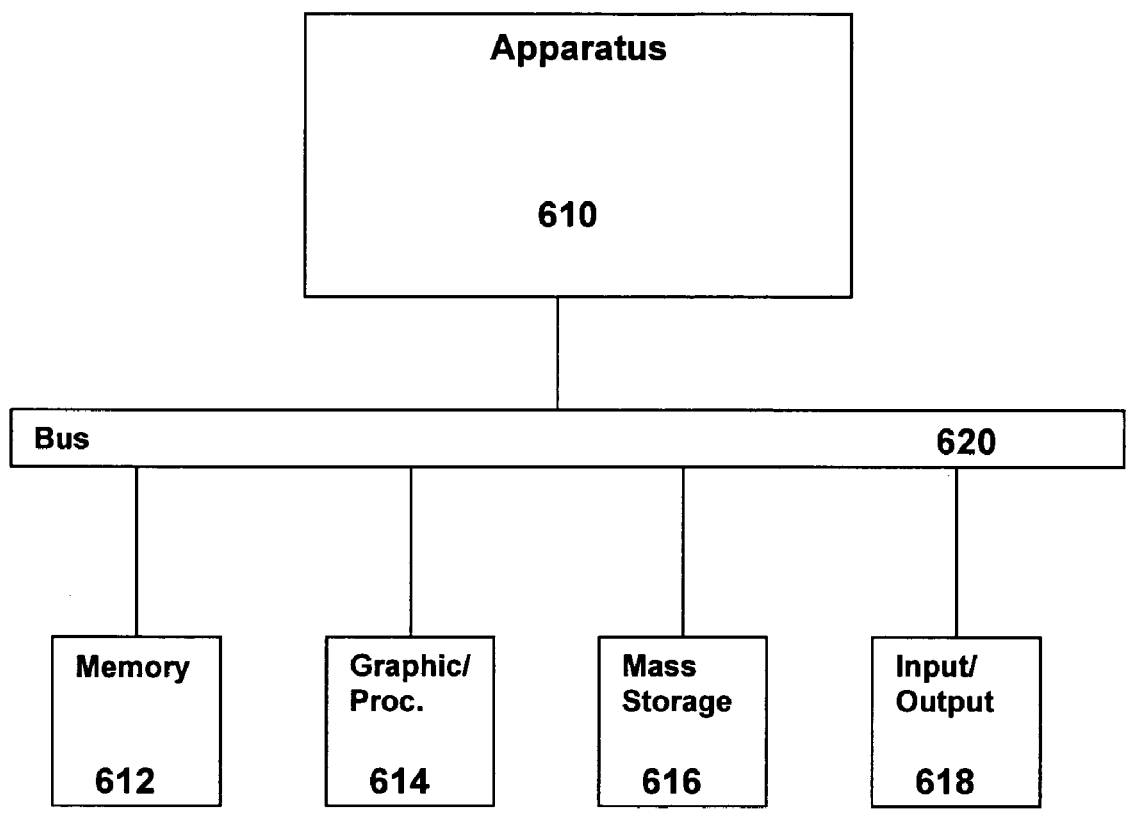
FIG. 6 illustrates one of many possible systems in which embodiments of the present invention may be utilized.

FIG. 6 illustrates one of many possible systems in which embodiments of the present invention may be utilized. In FIG. 6, a system 600 may include apparatus 610 which may be similar to the apparatus 500 shown in FIG. 5 having a heat source, a thermal management device, and an interface between the thermal management device and the heat source, where the interface has a number of nanostructures. Further, the apparatus 610 may be electrically coupled to a wiring board, which in turn, may be electrically coupled to various components.

In the illustrated embodiment of FIG. 6, a system 600 may include a memory device 612, a graphic processor 614, a mass storage device 616, and an input/output module 618 coupled to each other by way of a bus 620, as shown. Examples of memory device 612 include flash type memory, static random access (SRAM) memory, and dynamic random access memory (DRAM). Examples if mass storage device 616 include, but are not limited to, a hard disk drive, a compact disk drive (CD), a digital versatile drive (DVD), and so forth. Examples of the input/output modules 618 include, but not limited to, a keyboard, cursor control devices, a display, a network interface, and so forth. Examples of bus 620 include, but not limited to, a peripheral control interface (PCI) bus, and Industry Standard Architecture (ISA) bus, and so forth. In various embodiments, the system 600 may be a wireless mobile phone, a personal digital assistant, a pocket PC, a tablet PC, a notebook PC, a desktop computer, a set-top box, an entertainment unit, a DVD player, a server, and so forth.

Having described and illustrated the principles of the invention with reference to illustrated embodiments, it will be recognized that the illustrated embodiments can be modified in arrangement and detail without departing from such principles. And, though the foregoing discussion has focused on particular embodiments, other configurations are contemplated. In particular, even though expressions such as "in one embodiment," "in another embodiment," or the like are used herein, these phrases are meant to generally reference embodiment possibilities, and are not intended to limit the invention to particular embodiment configurations. As used herein, these terms may reference the same or different embodiments that are combinable into other embodiments.

Thus, it can be seen from the above descriptions, a novel apparatus including an interface between a heat source and a thermal management device having a number of nanostructures has been described.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Thus, the description is to be regarded as illustrative instead of restrictive on the invention.

Consequently, in view of the wide variety of permutations to the embodiments described herein, this detailed description is intended to be illustrative only, and should not be taken as limiting the scope of the invention. What is claimed as the invention, therefore, is all such modifications as may come within the scope and spirit of the following claims and equivalents thereto.

What is claimed is:

1. An apparatus comprising:
a thermal management device;
a heat source; and
an interface disposed between the thermal management device and the heat source, the interface having a plurality of nanostructures, the nanostructures having a plurality of polymer molecules, the polymer molecules including deoxyribonucleic acid (DNA) molecules, wherein the plurality of nanostructures include first nanostructures attached to the thermal management device, and second nanostructures attached to the heat source, wherein the first nanostructures include protrusions, wherein the second nanostructures include recesses, wherein the recesses are disposed in a pattern to receive the protrusions of the first nanostructures, and wherein the molecules are to facilitate adhesion of the first and second nanostructures to each other.

2. The apparatus of claim 1, wherein the thermal management device comprises a passive cooling device.

3. The apparatus of claim 2, wherein the passive cooling device comprises at least one of a heat sink, a heat spreader, heat pipes, and a heat slug.

4. The apparatus of claim 1, wherein the thermal management device comprises an active cooling device.

5. The apparatus of claim 4, wherein the active cooling device comprises at least one of an air jet impingement device and a dielectric liquid device.

6. The apparatus of claim 1, wherein the heat source comprises a rectangular piece of silicon material.

7. The apparatus of claim 1, wherein at least one of the first and second nanostructures includes carbon nanotubes.

8. The apparatus of claim 7, wherein each of the nanostructures has a diameter of 0.6 to 1.8 nanometers.

* * * * *

UNITED STATES PATENT AND TRADEMARK OFFICE
CERTIFICATE OF CORRECTION

PATENT NO. : 7,612,370 B2
APPLICATION NO. : 10/750488
DATED : November 3, 2009
INVENTOR(S) : Hannah et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1148 days.

Signed and Sealed this

Nineteenth Day of October, 2010

David J. Kappos
*Director of the United States Patent and Trademark Office*